(12) United States Patent
Wang et al.

(10) Patent No.: US 7,188,323 B2
(45) Date of Patent: Mar. 6, 2007

(54) RESTRICTED SCAN REORDERING TECHNIQUE TO ENHANCE DELAY FAULT COVERAGE

(75) Inventors: Seongmoon Wang, Plainsboro, NJ (US); Wei Li, Iowa City, IA (US); Srimat T. Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 301 days.

(21) Appl. No.: 10/892,022

(22) Filed: Jul. 15, 2004

(65) Prior Publication Data

US 2005/0235183 A1 Oct. 20, 2005

Related U.S. Application Data

(60) Provisional application No. 60/563,679, filed on Apr. 20, 2004.

(51) Int. Cl.
*G06F 17/50* (2006.01)
(52) U.S. Cl. .................................. 716/4; 716/5; 716/1
(58) Field of Classification Search .................... 716/4, 716/5, 1; 714/726
See application file for complete search history.

(56) References Cited

U.S. PATENT DOCUMENTS 6,148,425 A * 11/2000 Bhawmik et al. ........... 714/726

2004/0015803 A1 * 1/2004 Huang et al. ................. 716/10

OTHER PUBLICATIONS

Cheng, K-T et al., "A Partial Enhanced-Scan Approach to Robust Delay-Fault Test Generation for Sequential Circuits", International Test Conference 1991.
Dervisoglu, B.I. et al., "Design for Testability: Using Scanpath Techniques for Path-Delay Test and Measurement", International Test Conference 1991.
Patil, S. et al., "Skewed-Load Transition Test: Part II, Coverage", International Test Conference 1992.
Wang, S. et al., "A Scalable Scan-Path Test Point Insertion Technique to Enhance Delay Fault Coverage for Standard Scan Designs", ITC International Test Conference 2003.
Mao, W. et al., "Reducing Correlation to Improve Coverage of Delay Faults in Scan-Path Design", IEEE Transactions on Computer-Aided Design of Integrated Circuits and Systems, vol. 12, No. 5, May 1994.
Savir, J., "At-Speed Test is Not Necessarily an AC Test", International Test Conference 1991.

* cited by examiner

*Primary Examiner*—Sun James Lin

(57) ABSTRACT

Disclosed is a method and apparatus for improved delay fault testing by optimizing the order of scan cells in a scan chain. The order of the scan cells is determined by using a cost value for an order of scan cells, the cost value being computed from costs assigned to orderings of individual pairs of scan cells. These costs can be based on the number of faults that are untestable when the pair of scan cells are placed consecutively in the scan chain. The disclosed techniques allow for enhanced delay fault coverage by rearranging scan flip-flops without increasing routing overhead.

18 Claims, 5 Drawing Sheets

Initialize dependency undetectable fault list of every entry of the matrix to empty lists For every fault $f_{tr}$ in $F_r$ Find necessary assignments for launch patterns for $f_{tr}$ at line $l_r$ For every scan input $s_j$ that is assigned a necessary value $\nu$ For every scan input $s_i$ other than $s_j$ Set $s_i$ to $\nu$ and forward imply the value if $l_r$ is assigned a 1 and $f_{tr}$ is a STR or $l_r$ is assigned a 0 and $f_{tr}$ is a STF, the add $f_{tr}$ to dependency undetectable fault list of entry $c_{ij}$ of the matrix End For End For End For

FIG. 4

|       | $s_1$ | $s_2$ | $s_3$ | $s_4$ |
|-------|-------|-------|-------|-------|
| $s_1$ | 0     | 6     | 4     | 1     |
| $s_2$ | 5     | 0     | 2     | 0     |
| $s_3$ | 3     | 1     | 0     | 0     |
| $s_4$ | 0     | 1     | 0     | 0     |

FIG. 5

RESTRICTED SCAN REORDERING TECHNIQUE TO ENHANCE DELAY FAULT COVERAGE

This Utility Patent Application is a Non-Provisional of and claims the benefit of U.S. Provisional Patent Application Ser. No. 60/563,679 filed on Apr. 20, 2004, the contents of which are incorporated by reference herein

BACKGROUND OF THE INVENTION

The present invention is related to logic delay testing, in particular in the context of logic circuit designs.

Ascertaining the correct operation of digital logic circuits requires verification of functional behavior as well as correct operation at desired clock rates. Failures that cause logic to malfunction at desired clock rates are referred to as delay faults. These delay faults, particularly those occurring within integrated circuits, are typically due to random variations in process parameters that may cause device and/or wiring propagation delays to exceed specified limits. The detection of a delay fault normally requires application of a two-pattern test: a first pattern that initializes the targeted faulty circuit line to a desired value and a second pattern that launches a transition at the circuit line and propagates the fault effect to one or more primary outputs or scan flip-flops. In the "skewed-load" or "launch-by-shift" approach, the second pattern is obtained by a one bit shift of the first pattern, i.e., by shifting the first pattern by one more scan flip-flop. Hence, given a first pattern, there are only two possible patterns for the second pattern that differs only at the value for the first scan flip-flop whose scan input is connected to the scan chain input. Due to this dependency of second patterns on first patterns, transition delay fault coverage in a standard scan environment is sometimes significantly lower than stuck-at-fault coverage. If a pair of adjacent flip-flops drive the same fanout cone, then the correlation between the pair may create untestable delay faults.

There are a variety of techniques for increasing the delay fault coverage in a standard scan environment. For example, all or some of the standard scan cells can be replaced by enhanced scan cells which can hold two bits. See B. Dervisoglu and G. Stong, "Design for Testability: Using Scan-path Techniques for Path-Delay Test and Measurement," in Proc. International Test Conference, pp. 365–74 (1991); K.-T. Cheng, S. Devadas, and K. Keutzer, "A Partial Enhanced-Scan Approach to Robust Delay-Fault Test Generation for Sequential Circuits," in Proc. International Test Conference, pp. 403–10 (1991). If a pair of adjacent scan flip-flops are correlated (drive the same fanout cone), a combinational gate or flip-flop can be inserted between the flip-flops to break the shift dependency. See S. Patil and J. Savir, "Skewed-Load Transition Test: Part II, Coverage," in Proc. International Test Conference, pp. 714–22 (1992); S. Wang and S. T. Cahkradhar, "A Scalable Scan-Path Test Point Insertion Technique to Enhance Delay Fault Coverage for Standard Scan Designs," in Proc. International Test Conference, pp. 574–83 (2003). See also U.S. patent application Ser. No. 10/736,879, filed on Dec. 16, 2003, the contents of which are incorporated by reference herein.

A less intrusive way to enhance delay fault coverage is to rearrange the scan flip-flops to minimize the number of pairs of adjacent scan flip-flops that are correlated with each other (scan flip-flops that drive the same fanout cones). Scan flip-flops can be relocated to new locations in the scan chain so as to enhance delay fault coverage. In W. W. Mao and M. D. Ciletti, "Reducing Correlation to Improve Coverage of Delay Faults in Scan-Path Design," IEEE Trans. on Computer-Aided Design of Integrated Circuits and System, pp. 638–46 (1994), the circuit's topology is used to find a scan order that minimizes the number of adjacent scan flip-flop pairs that drive the same fanout cones. However, it turns out that even if a pair of adjacent flip-flops drive the same fanout cone, it may not cause any shift dependency untestable faults. In J. Savir and R. Berry, "At-Speed Test is not Necessarily an AC Test," in Proc. International Test Conference, pp. 722–28 (1991), a circuit function rather than a simple topology is used to find a best scan order. A fault simulation is run with a set of random patterns for a large number of randomly generated scan orders. The number of untestable faults for each scan order is counted and the scan order that achieves the highest fault coverage is selected. This, unfortunately, requires prohibitive CPU time and is not practical for large circuits that have a million or more gates.

Accordingly, there is a need for a more practical methodology for enhancing delay fault coverage that can be achieved with a reasonable resources even for large circuits.

SUMMARY OF INVENTION

The present invention is directed to improved delay fault testing by optimizing the order of scan cells in a scan chain. The order of the scan cells is determined by using a cost value for an order of scan cells, the cost value being computed from costs assigned to orderings of individual pairs of scan cells. These costs, referred to herein as scan cell ordering costs, can, for example, be based on the number of faults that are untestable when the pair of scan cells are placed consecutively in the scan chain. A representation of the scan cell ordering costs can be constructed by identifying necessary assignments of initialization and launch patterns of scan cells in the scan chain for every fault in a fault list and by marking the fault as untestable if there is a conflict in the necessary assignments. The necessary assignments of initialization patterns of scan cells in the scan chain can be readily identified by applying forward implication to the necessary values for a launch pattern for the fault. It is advantageous to reduce the number of faults in the fault list by pruning the list of faults that can be detected independent of scan order and by grouping equivalent faults. An optimal order for the scan cells in the scan chain can then be selected, preferably by using some iterative search procedure such as simulated annealing. It is advantageous to select only scan orders that do not increase routing overhead, i.e., those orderings that obey what the inventors refer to as a relocation limit. The cost value for an order of scan flip-flops is computed from costs of orders of individual pairs of scan cells, which can be represented as an n×n matrix, where n is the number of scan cells in the scan chain. Each element of the matrix represents a number of untestable faults caused by placing a pair of scan cells consecutively in the scan chain, the overall cost of a given scan order computed by simply summing the costs of all pairs of scan cells in the scan chain.

Unlike other solutions, the present invention can enhance delay fault coverage by rearranging scan flip-flops without increasing routing overhead, which may result in routing congestion or increase in chip area. In addition, the present invention takes advantage of using the circuit function rather than topology while still achieving reasonable CPU times.

These and other advantages of the invention will be apparent to those of ordinary skill in the art by reference to the following detailed description and the accompanying drawings.

BRIEF DESCRIPTION OF DRAWINGS

FIG. 4 is pseudo-code for the process of building the cost matrix, in accordance with an embodiment of this aspect of the invention.

FIG. 5 is an example of a cost matrix.

DETAILED DESCRIPTION

The number of distinct pattern pairs that can be applied using the skewed load approach is $2(2^n-1)$ compared to $2^n(2^n-1)$ that can be applied by enhanced scan, where n is the number of scan inputs of the circuit under test. Hence, some transition delay faults that are detectable in an enhanced scan environment are undetectable when the skewed-load approach is used due to shift dependency. The faults that are undetectable by using the skewed-load approach but detectable under an enhanced scan environment are referred to herein as "shift dependency undetectable faults."

Figure 1:
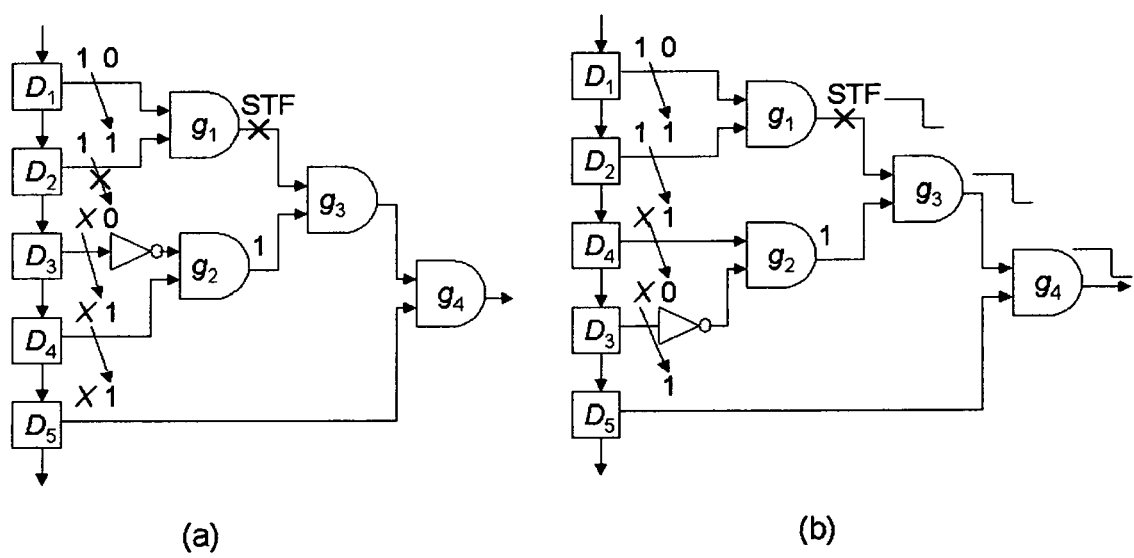
FIG. 1A shows an example of a shift dependency untestable fault.
FIG. 1B shows how swapping scan flip-flops can make the untestable fault testable.

FIG. 1A shows an example of a shift dependency undetectable fault. The slow-to-fall (STF) fault in the circuit shown in FIG. 1A is untestable under a standard scan environment when the skewed-load approach is used. In order to initialize the STF fault, both D1 and D2 should be assigned 1's at an initialization cycle. The 1 at D2 at the initialization cycle shifts to D3 at the next cycle (launch cycle). However, in order to propagate the fault effect at the faulty line to the output of g3 at the launch cycle, D3 should be assigned a 0. This requirement conflicts with the 1 that is shifted from D2 and the STF is untestable. FIG. 1B shows how swapping scan flip-flops can make the untestable fault testable. As depicted in FIG. 1B, if locations of flip-flops D3 and D4 are swapped, then the STF fault becomes testable. This shows that transition delay fault coverage for a scan design can be improved by carefully reordering scan chains.

Figure 2:
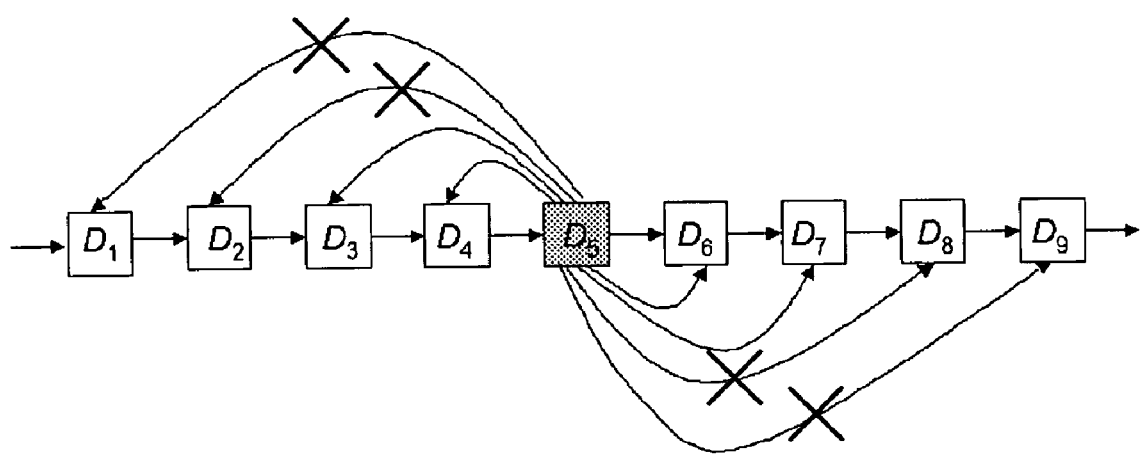
FIG. 2 illustrates restricted scan ordering, in accordance with an embodiment of an aspect of the invention.

Scan chains are typically ordered to minimize routing overhead to avoid routing congestion, which may result in chip area overhead. Hence, swapping locations of two scan flip-flops that are far way in the scan chain to enhance delay fault coverage may result in significant increase in routing. It is one of the reasons that reordering scan chains to improve delay fault coverage is not widely used in the industry today. Even if swapping locations of two scan flip-flops that are far away in the scan chain increases routing overhead substantially, swapping locations of flip-flops that are close neighbors of each other will not increase routing. For example, in FIG. 2, swapping locations of scan flip-flop $D_5$ with $D_3$, $D_4$, $D_6$, or $D_7$ does not increase routing but swapping the location of scan flip-flop $D_5$ with flip-flops other than those flip-flops may increase routing substantially. The maximum distance that a scan flip-flop can move to from its original location without increasing routing is referred to herein as the relocation limit. Information on the locations and relocation limits of flip-flops can be obtained from physical designs after placement and routing steps. In accordance with an embodiment of an aspect of the present invention, this information can be advantageously utilized to reorder scan chains to improve delay fault coverage without affecting routing.

The scan order is determined using the circuit's function rather than topology. However, unlike prior art which uses fault simulation for a large number of randomly generated scan chain orders to find a best scan order, it is advantageous to utilize an n×n cost matrix, where n is the number of scan flip-flops in the scan chain. Each element of the matrix represents the number of untestable faults caused by placing a pair of scan flip-flops consecutively in the scan chain. The overall cost of a given scan order is computed by simply summing up costs (elements of the matrix) of all pairs of scan flip-flops in the scan chain without any further logic/fault simulation. An iterative search algorithm such as simulated annealing uses the overall costs of different scan orders and finds the scan order that has the minimum cost, i.e., the total number of untestable faults. If the design has multiple scan chains, we can use multiple tables each of which is built per a scan chain. Every scan flip-flop in the best scan order selected should preferably satisfy its relocation limit.

Figure 3:
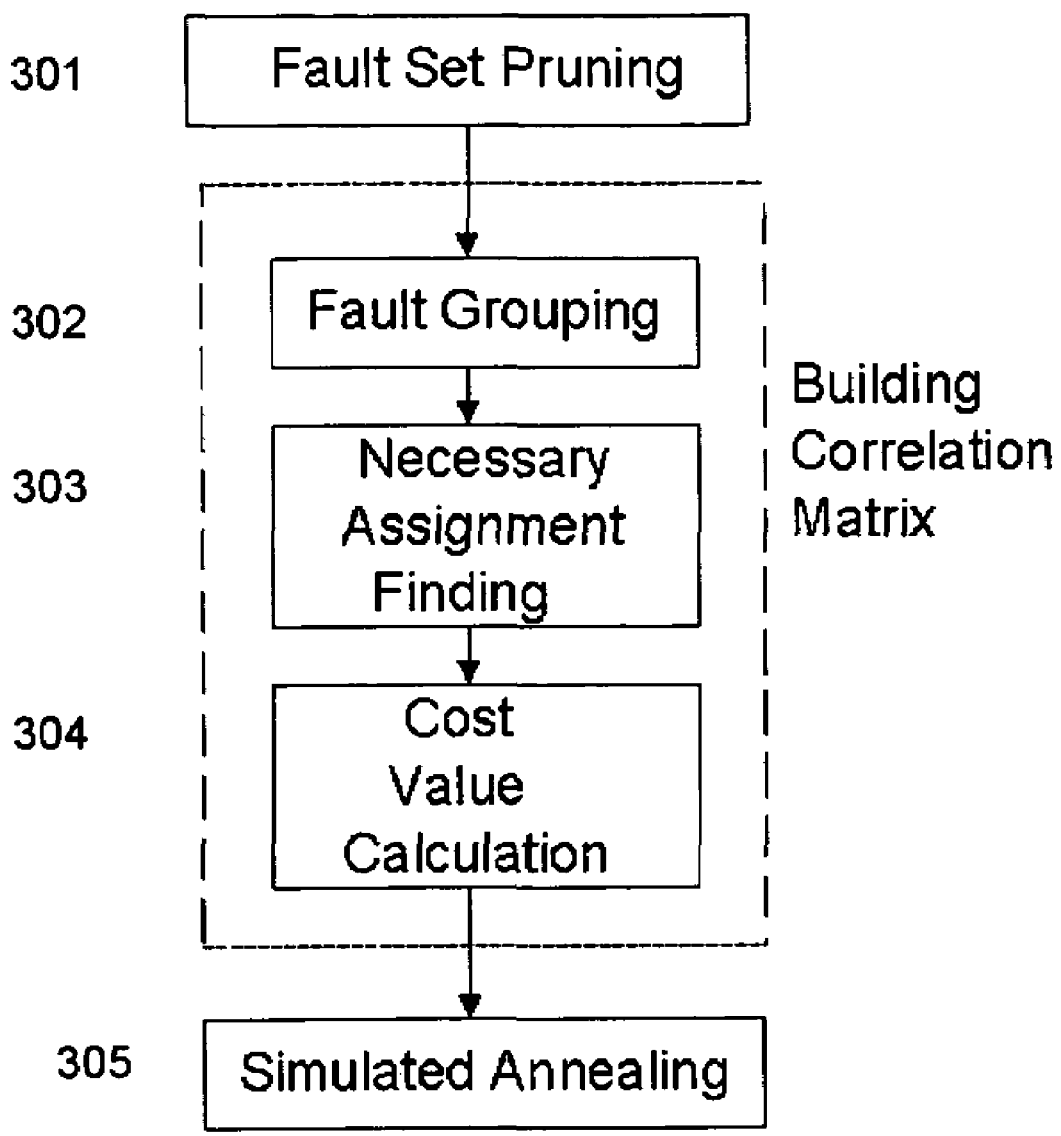
FIG. 3 is flowchart of processing performed, in accordance with an embodiment of an aspect of the invention.

FIG. 3 is flowchart of processing performed, in accordance with an embodiment of this aspect of the invention. FIG. 3 describes the overall flow to rearrange scan flip-flops obeying relocation limits of scan flip-flops to achieve the highest fault coverage. Detailed operations during each step are described in the following:

Step 301—Fault Set Pruning step: Transition delay faults that can always be detected independent of scan order are preferably removed from the fault list.

Step 302—Fault Grouping step: The remaining faults can be partitioned into groups such that all faults in each group are equivalent. If all tests for fault a is also tests for fault b, and vice versa, then fault a is equivalent to fault b. This will advantageously reduce time complexity of the following step.

Step 303—Necessary Assignment Finding step: For every fault group, a fault that represents the fault group is selected and input assignments that are necessary to detect the corresponding stuck-at fault for the representative fault (if the representative fault is a slow-to-rise (STR) and/or a (STF) fault, then the corresponding stuck-at fault is a s-a-1 (s-a-0)) are identified.

Step 304—Cost Value Calculation step: The number of faults that are untestable when a pair of scan flip-flops are placed consecutively in the chain is computed for every pair of scan flip-flops. They are computed from necessary input assignments, which are computed from the previous step, and additional implication processes. Consider finding faults that are untestable when the scan output of $s_i$ is connected to the scan input of $s_j$, i.e, $s_j$ is located immediately after $s_i$. Assume that it is found from necessary input assignments that scan flip-flop $s_j$ must be assigned a 1 to detect STR fault f at any launch pattern. This implies that $s_i$ cannot be set to a 0 at any initialization pattern (the value 1 required at $s_j$ at a launch cycle should be shifted from $s_j$ at the previous cycle, i.e., initialization cycle). Hence, if it is necessary to set $s_i$ to a 0 to initialize fault f, then f is untestable due to conflict with the 1 required at $s_j$ at the following launch cycle for the given order of the two scan flip-flop. A cost matrix can be built with numbers of untestable faults for all possible pairs of scan flip-flops in the scan chain.

Step 305—Optimization step: Given the cost matrix, an optimization algorithm can be utilized to find the scan order that has the minimum cost. For example, and without limitation, simulated annealing can be utilized since it is one of the most popular iterative search algorithms. During the simulated annealing process, it is preferable that any randomly generated scan order should satisfy the relocation limit of every scan flip-flops. Other iterative search algorithms can also be readily used. The cost for a scan chain order can be calculated by simply summing up the costs of every pair of flip-flops in the order. For example, if scan flip-flops are ordered as $s_1$, $S_2$, $S_3$, and $s_4$ (the scan input of $s_1$ is connected to the input of the scan chain and the scan output of $s_4$ is connected to the output of the scan chain), the total cost is 6 (sum of cost($s_1$-$s_2$)=5, cost($s_2$-$s_3$)=1, and cost($s_3$-$s_4$)=0), where notation $s_1$-$s_2$ denotes that scan flip-flop is located immediately after $s_2$ and cost ($s_1$-$s_2$) denotes the cost, i.e., number of untestable faults, for the order of the scan flip-flop pair.

FIG. 4 sets forth more detailed pseudo-code for the process of building the cost matrix. As set forth in FIG. 4, for every fault in a fault list, the necessary assignments of launch patterns for every fault are identified, which activate faults and propagate fault effects to outputs. Then, the necessary assignments of initialization patterns can be found by simple forward implications. Assume that a scan input $s_j$ must be assigned a 1 to activate a STF fault f at line l, i.e., $s_j$ is a necessary assignment of launch patterns for the STF f at line l. If scan input $s_i$ is placed immediately before $s_j$ in the scan chain, then scan input $s_i$ should always be assigned a 1 in every initialization cycle to satisfy the necessary assignment condition at $s_j$ in the following cycle (the 1 assigned at $s_i$ shifts to $s_j$ at the following cycle). If setting $s_i$ to a 1 implies a 0 at line l, then $s_i$ must be assigned a 0 in any initialization pattern to initialize f, i.e. $s_i$=0 is a necessary assignment to initialize fault f. Hence, placing $s_i$ immediately before $s_j$ causes a conflict and makes f undetectable. Since it only requires simple forward implications, finding necessary assignments of initialization patterns is significantly faster than finding necessary assignments of launch patterns.

The necessary assignments of launch patterns for every fault can be identified, for example, using a SAT (satisfiability) based automatic test pattern generator (ATPG). For every fault, the ATPG can generate a formula in conjunctive normal form for the fault injected circuit. Since every launch pattern for the fault should satisfy the formula, all single literal clauses represent the necessary assignments in the inputs for the given fault. More necessary assignments can be identified by then propagating the necessary input values. If there are a large number of faults, then finding the necessary assignments may be costly. Accordingly, as discussed above, the run time for the process can be reduced by identifying equivalent faults.

Figure 5:
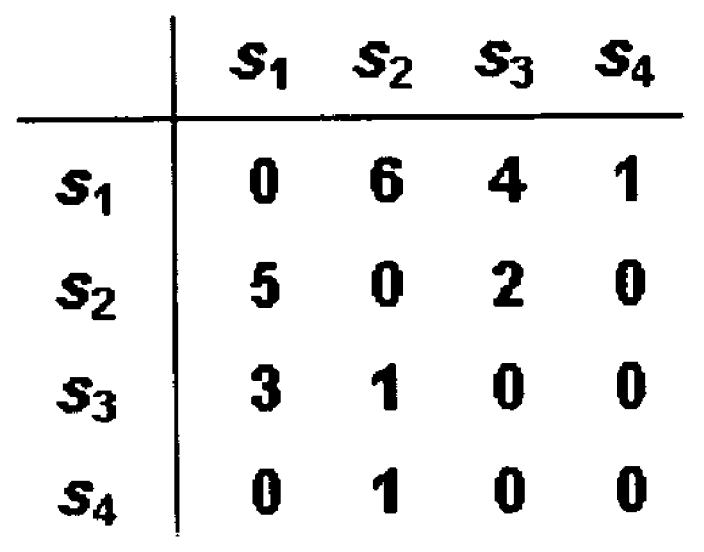

FIG. 5 shows an example cost matrix. The matrix shows that six transition delay faults are untestable when $s_1$ is located immediately after $s_2$ in the scan chain while five transition delay faults are untestable when $s_2$ is located immediately after $s_1$ in the scan chain.

What is claimed is:

1. A logic circuit comprising a delay fault testing circuit, said delay fault testing circuit including a scan chain of scan cells, the scan cells in the scan chain being ordered so as to minimize a cost value computed from a plurality of scan cell ordering costs, each scan cell ordering cost assigned to an ordering of a pair of scan cells in the scan chain; wherein the scan cell ordering cost is based on a number of faults that are untestable when the pair of scan cells are placed consecutively in the scan chain.

2. The logic circuit of claim 1 wherein the number of faults that are untestable when the pair of scan cells are placed consecutively in the scan chain is computed by identifying necessary assignments of initialization and launch patterns of scan cells in the scan chain for every fault in a fault list and by marking the fault as untestable if there is a conflict in the necessary assignments.

3. The logic circuit of claim 2 wherein the necessary assignments of initialization and launch patterns of scan cells in the scan chain are identified from finding necessary assignments for all launch patterns for the fault and, for every scan cell that is assigned a necessary value for the launch pattern, setting the found necessary assignment to each of other scan inputs and forward implying the necessary assignment to internal circuit lines so as to identify conflicts with the necessary assignments of initialization patterns of the fault.

4. The logic circuit of claim 2 wherein the number of faults in the fault list is reduced by pruning the fault list of faults that can be detected independent of scan order.

5. The logic circuit of claim 2 wherein the number of faults in the fault list is reduced by grouping equivalent faults.

6. The logic circuit of claim 1 wherein the scan cells are scan flip-flops.

7. A logic circuit comprising a delay fault testing circuit, said delay fault testing circuit including a scan chain of scan cells, the scan cells in the scan chain being ordered so as to minimize a cost value computed from a plurality of scan cell ordering costs, each scan cell ordering cost assigned to an ordering of a pair of scan cells in the scan chain;
wherein an iterative search is used to find an ordering of the scan cells in the scan chain that minimizes the cost value.

8. The logic circuit of claim 7 wherein only orderings of the scan cells in the scan chain that do not increase routing overhead are considered in the iterative search.

9. A method of testing a logic circuit comprising steps of:
assigning scan cell ordering costs to orderings of pairs of scan cells in a scan chain for a delay fault circuit, each scan cell ordering cost based on a number of faults that are untestable when a pair of scan cells are placed consecutively in the scan chain; and
selecting an ordering of scan cells in the scan chain that minimizes a cost value computed from the scan cell ordering costs so as to enhance delay fault coverage.

10. The method of claim 9 wherein the step of assigning a scan cell ordering cost comprises steps of:
identifying necessary assignments of initialization and launch patterns of scan cells in the scan chain for every fault in a fault list; and
marking the fault as untestable if there is a conflict in the necessary assignments.

11. The method of claim 10 wherein the step of identifying necessary assignments of initialization and launch patterns of scan cells comprises steps of:
finding necessary assignments for all launch patterns for the fault;
for every scan cell that is assigned a necessary value for the launch pattern, setting the found necessary assigning to each of other scan inputs and forward implying the necessary assignment to internal circuit lines so as to identify conflicts with the necessary assignments of initialization patterns of the fault.

12. The method of claim 10 wherein the number of faults in the fault list is reduced by pruning the fault list of faults that can be detected independent of scan order.

13. The method of claim 10 wherein the number of faults in the fault list is reduced by grouping equivalent faults.

14. The method of claim 9 wherein an iterative search is used to select an ordering of the scan cells in the scan chain that minimizes the cost value.

15. The method of claim 14 wherein only orderings of the scan cells in the scan chain that do not increase routing overhead are considered in the iterative search.

16. The method of claim 14 wherein the iterative search is conducted using simulated annealing.

17. The method of claim 9 wherein the scan cells are scan flip-flops.

18. A logic circuit comprising a delay fault testing circuit, said delay fault testing circuit including a scan chain of scan cells, the scan cells in the scan chain being ordered so as to minimize a cost value computed from a sum of a plurality of scan cell ordering costs, each scan cell ordering cost assigned to an ordering of a pair of scan cells in the scan chain and based on a number of faults that are untestable when the pair of scan cells are placed consecutively in the scan chain and wherein the number of faults that are untestable when the pair of scan cells are placed consecutively in the scan chain is computed by identifying necessary assignments of initialization and launch patterns of scan cells in the scan chain for every fault in a fault list and by marking the fault as untestable if there is a conflict in the identified necessary assignments.

* * * * *